(12) United States Patent
Drouin et al.

(10) Patent No.: US 12,445,102 B2
(45) Date of Patent: Oct. 14, 2025

(54) METHOD FOR PREPARING A THIN LAYER OF FERROELECTRIC MATERIAL

(71) Applicant: Soitec, Bernin (FR)

(72) Inventors: Alexis Drouin, La Buissiere (FR); Isabelle Huyet, Crolles (FR); Morgane Logiou, Crolles (FR)

(73) Assignee: Soitec, Bernin (FR)

( * ) Notice: Subject to any disclaimer, the term of this patent is extended or adjusted under 35 U.S.C. 154(b) by 937 days.

(21) Appl. No.: 17/430,662

(22) PCT Filed: Mar. 26, 2020

(86) PCT No.: PCT/EP2020/058460
§ 371 (c)(1),
(2) Date: Aug. 12, 2021

(87) PCT Pub. No.: WO2020/200986
PCT Pub. Date: Oct. 8, 2020

(65) Prior Publication Data
US 2024/0072753 A1 Feb. 29, 2024

(30) Foreign Application Priority Data
Mar. 29, 2019 (FR) .................................... 1903359

(51) Int. Cl.
*H01R 31/00* (2006.01)
*H03H 3/08* (2006.01)
*H03H 9/02* (2006.01)

(52) U.S. Cl.
CPC .......... *H03H 3/08* (2013.01); *H03H 9/02559* (2013.01); *H03H 9/02574* (2013.01)

(58) Field of Classification Search
CPC .. H03H 9/02559; H03H 9/02574; H03H 3/08; H01L 21/76254; H10N 30/073
See application file for complete search history.

(56) References Cited

U.S. PATENT DOCUMENTS 6,395,612 B1     5/2002  Amanuma
6,500,711 B1 *  12/2002  Chang ............... H01L 21/32105
                                                              438/257
(Continued)

FOREIGN PATENT DOCUMENTS

FR          2860341 B1     12/2005
FR          2914492 A1     10/2008
(Continued)

OTHER PUBLICATIONS

International Search Report for International Application No. PCT/EP2020/058460 dated Apr. 22, 2020, 2 pages.
(Continued)

*Primary Examiner* — Paul D Kim
(74) *Attorney, Agent, or Firm* — TraskBritt

(57) ABSTRACT

A method for preparing a monodomain thin layer of ferroelectric material comprises: implanting light species in a ferroelectric donor substrate in order to form an embrittlement plane and to define a first layer therein; assembling the donor substrate with a support substrate by means of a dielectric assembly layer; and fracturing the donor substrate at the embrittlement plane. The dielectric assembly layer comprises an oxide having a hydrogen concentration lower than that of the first layer or preventing the diffusion of hydrogen to the first layer, or the dielectric assembly layer comprises a barrier preventing the diffusion of hydrogen to the first layer. A heat treatment of a free face of the first layer is used to diffuse the hydrogen contained therein and cause the multidomain transformation of a surface portion of this first layer, followed by a thinning of the first layer in order to remove the surface portion.

19 Claims, 2 Drawing Sheets

(56) References Cited

U.S. PATENT DOCUMENTS

| | | | |
|---|---|---|---|
| 6,593,212 B1 | 7/2003 | Kub et al. | |
| 7,456,064 B2 * | 11/2008 | Manchanda | H01L 21/28202 |
| | | | 428/689 |
| 11,469,137 B2 * | 10/2022 | Reboh | H01L 27/1203 |
| 2005/0181559 A1 | 8/2005 | Natori et al. | |
| 2006/0222895 A1 | 10/2006 | Higuchi et al. | |
| 2007/0022940 A1 * | 2/2007 | Boussagol | H01L 21/76254 |
| | | | 117/1 |
| 2008/0074211 A1 | 3/2008 | Miles et al. | |
| 2009/0221131 A1 * | 9/2009 | Kubota | H01L 21/76254 |
| | | | 438/478 |
| 2010/0088868 A1 | 4/2010 | Kando et al. | |
| 2010/0133959 A1 * | 6/2010 | Yamazaki | C04B 35/475 |
| | | | 310/365 |
| 2014/0113434 A1 * | 4/2014 | Tauzin | H01L 21/76254 |
| | | | 438/458 |
| 2015/0155480 A1 | 6/2015 | Jo | |
| 2017/0062698 A1 | 3/2017 | To et al. | |
| 2017/0221839 A1 | 8/2017 | Kononchuk et al. | |
| 2019/0013235 A1 | 1/2019 | Peidous et al. | |
| 2020/0186117 A1 | 6/2020 | Huyet et al. | |
| 2021/0005738 A1 * | 1/2021 | Okazaki | H01L 21/02315 |

FOREIGN PATENT DOCUMENTS

| | | |
|---|---|---|
| FR | 2933233 A1 | 11/2010 |
| FR | 2953640 B1 | 2/2012 |
| FR | 3068508 B1 | 7/2019 |
| FR | 3078822 B1 | 2/2020 |
| JP | 11-135736 A | 5/1999 |
| JP | 2005-229001 A | 8/2005 |
| JP | 2010-212426 A | 9/2010 |
| JP | 2017-532758 A | 11/2017 |
| JP | 2020-526008 A | 8/2020 |
| WO | 2019/002080 A1 | 1/2019 |

OTHER PUBLICATIONS

International Written Opinion for International Application No. PCT/EP2020/058460 dated Apr. 22, 2020, 5 pages.
Japanese Decision of Refusal for Japanese Application No. 2021-557768, dated Aug. 27, 2024, 6 pages with English translation.
Japanese Notice of Reasons for Refusal for Japanese Application No. 2021-557768, dated Feb. 27, 2024, 13 pages with English translation.
Taiwanese Search Report for Application No. 11221123790 dated Nov. 7, 2023, 1 page.
Singapore Written Opinion for Application No. 11202110112U dated Jun. 9, 2023, 10 paes.
Chinese First Office Action for Application No. 202080017749.0 dated Sep. 27, 2024, 12 pages.
Japanese Notice of Termination of Reconsideration by Examiners before Appeal Proceedings for Application No. 2021-557768 dated Feb. 18, 2025, 3 pages.

* cited by examiner

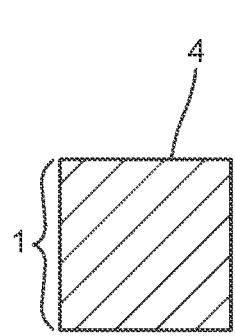 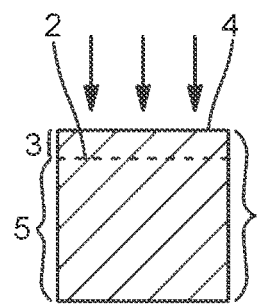 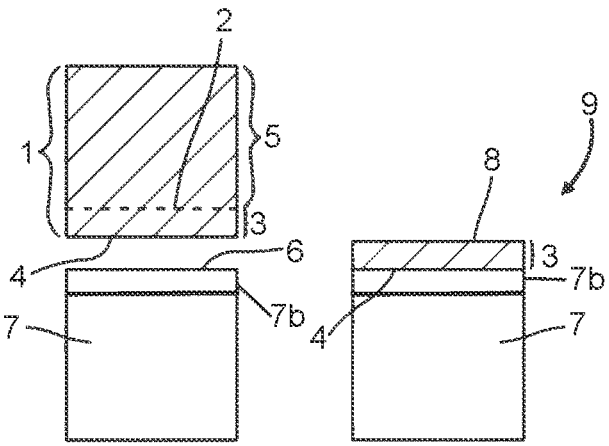 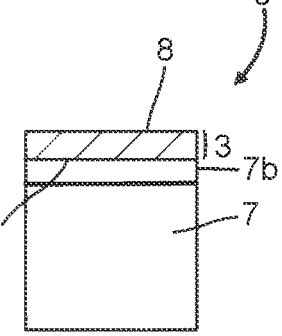
FIG. 1A    FIG. 1B    FIG. 1C    FIG. 1D
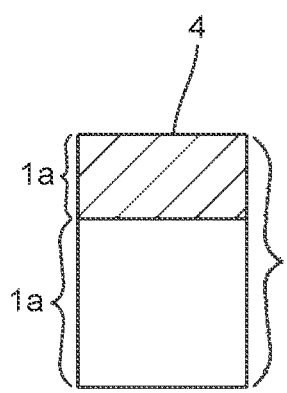 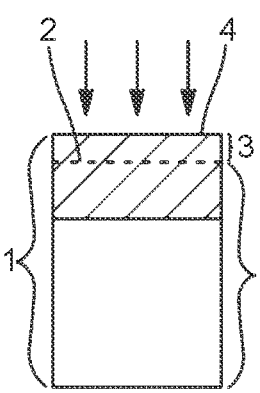 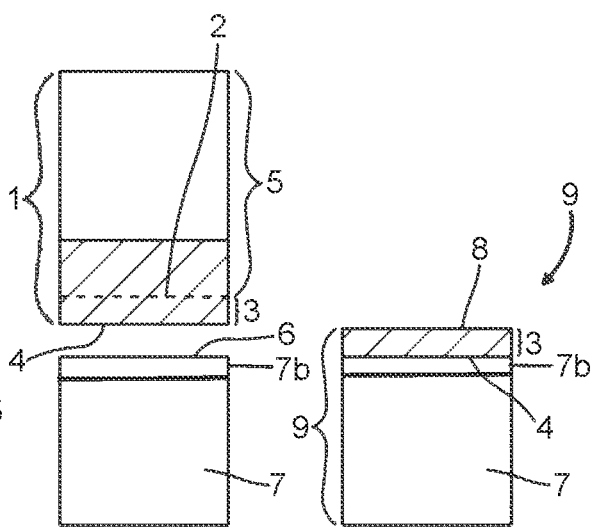 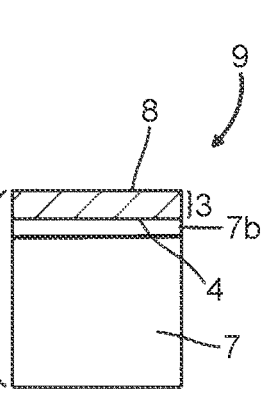
FIG. 2A    FIG. 2B    FIG. 2C    FIG. 2D

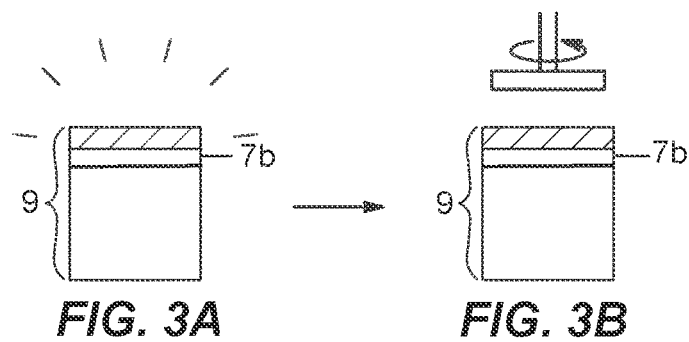
FIG. 3A  FIG. 3B
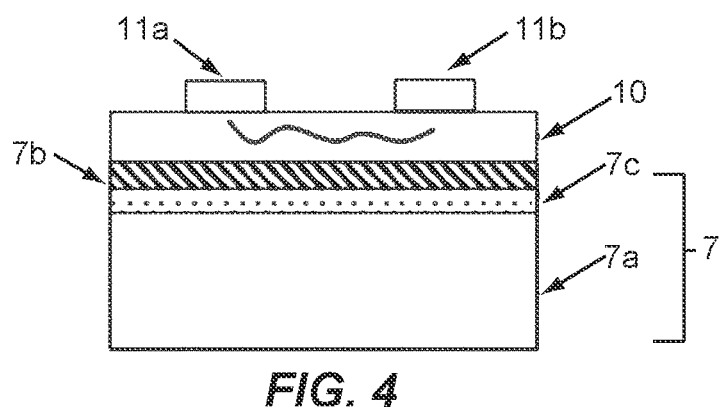
FIG. 4

METHOD FOR PREPARING A THIN LAYER OF FERROELECTRIC MATERIAL

CROSS-REFERENCE TO RELATED APPLICATIONS

This application is a national phase entry under 35 U.S.C. § 371 of International Patent Application PCT/EP2020/058460, filed Mar. 26, 2020, designating the United States of America and published as International Patent Publication WO 2020/200986 A1 on Oct. 8, 2020, which claims the benefit under Article 8 of the Patent Cooperation Treaty to French Patent Application Serial No. FR1903359, filed Mar. 29, 2019.

TECHNICAL FIELD

The present disclosure relates to a method for preparing a thin layer of ferroelectric material. More particularly, it relates to a preparation method making it possible to maintain the monodomain nature of the ferroelectric material in the thin layer of the final product. This preparation method is used, for example, in the fields of microelectronics, micromechanics, photonics, etc.

BACKGROUND

A ferroelectric material is a material that has electric polarization in the natural state, which polarization can be reversed by applying an external electric field. "Ferroelectric domain" refers to each region in a single piece of the material in which the polarization is uniform (all the dipole moments are aligned parallel to each other in a given direction). A ferroelectric material can therefore be characterized as "monodomain" in the case where this material is formed by a single region in which the polarization is uniform or as "multidomain" in the case where the ferroelectric material comprises a plurality of regions having polarities that may be different.

Various methods are known from the state of the art for forming a thin layer of ferroelectric material. It may, for example, be a technique using molecular beam epitaxy, plasma sputtering, laser pulsed deposition, or even the application of SMART CUT™ technology, whereby a thin layer is removed from a solid substrate of ferroelectric material by fracturing on a fragile zone (or embrittlement plane) formed in the solid substrate by implantation of light species.

The present disclosure more particularly relates to the preparation of a thin ferroelectric layer obtained by applying such a method. Document US20100088868 notes that a ferroelectric layer of lithium tantalate transferred by a method implementing an implantation of hydrogen leads to the formation of a multidomain layer. Such a feature makes the layer unfit for use, since it affects the performance of the devices that are to be formed on/in the thin layer, for example, surface acoustic wave devices (SAW).

Document FR3068508 discloses the finishing of a thin ferroelectric layer transferred onto a support by means of an intermediate layer, and by application of the SMART CUT method. In one example, this finishing comprises heat treatment of the thin layer, followed by polishing. According to this document, this sequence would allow the initial monodomain properties of the thin ferroelectric layer to be restored. Additional analyses, however, show that this finishing sequence alone could not guarantee the monodomain nature of the layer over its entire thickness, that is to say, from its interface with the intermediate layer to its free surface. More particularly, these analyses using PFM ("Piezoresponse Force Microscopy") measurement, which generally extend over a depth of approximately 50 nm from the measurement surface, have confirmed that the surface portion of the thin layer was indeed monodomain, but that a buried portion juxtaposed with the intermediate layer could prove to be multidomain. To carry out this "buried" PFM measurement, the layer was gradually thinned by chemical-mechanical polishing in order to approach the measurement surface of this intermediate layer.

Document FR2914492 also discloses a method for manufacturing a thin layer of ferroelectric material using SMART CUT technology. In this document, as in the aforementioned document US20100088868, the layer that is removed and transferred onto a support substrate is prepared by subjecting it to an electric field so as to improve or restore its monodomain ferroelectric properties. Such a treatment requires the presence of a pair of electrodes placed on either side of the ferroelectric layer to be treated, for example, in electrical contact with this layer. It is not always possible to have such a pair of electrodes, in particular, when the ferroelectric layer is transferred onto an electrically insulating substrate or onto an electrically insulating layer.

BRIEF SUMMARY

An aim of the present disclosure is to propose a method for preparing a thin layer of ferroelectric material partially addressing at least the aforementioned drawbacks. It more particularly relates to a method for transferring a layer of ferroelectric material implementing a step of implanting light species, the method preserving or being able to restore the monodomain quality of the transferred layer over its entire thickness. It is therefore unnecessary, in the layer preparation method, to subject the latter to an electric field to restore its monodomain quality, and it can be transferred onto an electrically insulating substrate or provided with a dielectric layer.

In order to achieve this aim, the subject matter of the present disclosure proposes a method for preparing a thin monodomain layer of ferroelectric material comprising the following steps:
  implanting light species in a first face of a ferroelectric donor substrate to form an embrittlement plane and define a first layer between the embrittlement plane and the first face of the donor substrate;
  assembling the first face of the donor substrate to a support substrate by means of a dielectric assembly layer;
  fracturing the donor substrate at the embrittlement plane in order to transfer the first layer onto the support substrate and expose a free face of the first layer; and
  finishing the first layer, this finishing comprising heat treatment of the free face of the first layer, followed by thinning of the first layer to form the thin monodomain layer.

According to the present disclosure, the dielectric assembly layer comprising an oxide has a hydrogen concentration lower than that of the first layer or prevents the diffusion of hydrogen toward the first layer, or the dielectric assembly layer comprises a barrier preventing the diffusion of hydrogen toward the first layer.

Surprisingly, this precise series of preparation steps combined with the specific nature of the assembly layer results in the formation of a final thin layer having monodomain polarization over its entire thickness and a satisfactory crystal and surface quality.

According to other advantageous and non-limiting characteristics of the present disclosure, taken alone or in any technically feasible combination:

- the thinning comprises chemical-mechanical polishing applied to the free face of the first layer;
- the heat treatment is carried out at a temperature between 300° C. and the Curie temperature of the ferroelectric material making up the first layer, and for a period of between 30 minutes and 10 hours;
- the heat treatment is carried out under an oxidizing or neutral gaseous atmosphere;
- the donor substrate comprises a ferroelectric material chosen from $LiTaO_3$ or $LiNbO_3$;
- the ferroelectric material has a crystal direction between 30° and 60° RY;
- the material of the support substrate is silicon;
- the donor substrate is a block of solid material;
- the donor substrate comprises a thick layer of ferroelectric material positioned on a manipulator substrate;
- wherein the manipulator substrate has a thermal expansion coefficient identical or close to the thermal expansion coefficient of the support;
- the material of the first layer and the material of the support substrate have different thermal expansion coefficients;
- the support substrate is provided with a charge trapping layer;
- the dielectric assembly layer comprises an oxide having nitrogen in a nitrogen/oxygen ratio greater than or equal to 0.01 or 0.05;
- the dielectric assembly layer comprises a silicon oxide having nitrogen in a nitrogen/oxygen ratio of between 0.01 and 0.25 or between 0.05 and 0.01;
- the dielectric assembly layer is formed by a stack comprising a first oxide layer disposed on the side of the support substrate and a layer of silicon nitride disposed on the side of the first layer.

According to another aspect, the present disclosure proposes a device comprising:

- a thin fully monodomain layer of a ferroelectric material layer;
- a dielectric assembly layer in contact with the thin layer and comprising an oxide preventing the diffusion of hydrogen toward the thin layer, or comprising a barrier preventing the diffusion of hydrogen toward the first layer;
- a support in contact with the dielectric layer.

According to other advantageous and non-limiting characteristics of this aspect of the present disclosure, taken alone or in any technically feasible combination:

- the support substrate is provided with a charge trapping layer placed between a solid part of the support and the dielectric assembly layer;
- the dielectric assembly layer comprises an oxide having nitrogen in a nitrogen/oxygen ratio greater than or equal to 0.01 or 0.05;
- the dielectric assembly layer comprises a silicon oxide having nitrogen in a nitrogen/oxygen ratio of between 0.01 and 0.25 or between 0.05 and 0.01;
- the dielectric assembly layer is formed by a stack comprising a first oxide layer disposed on the side of the support substrate and a layer of silicon nitride disposed on the side of the first layer.

BRIEF DESCRIPTION OF THE DRAWINGS

Other features and advantages of the present disclosure will become apparent from the detailed description of embodiments of the present disclosure that follows with reference to the accompanying figures, in which:

FIGS. 1A to 1D show a first embodiment of a method according to the present disclosure;

FIGS. 2A to 2D show a second embodiment of a method according to the present disclosure;

FIGS. 3A and 3B schematically show a method for preparing a layer according to the present disclosure;

FIG. 4 shows a surface acoustic device that can be produced using a method according to the present disclosure.

DETAILED DESCRIPTION

For the sake of the simplification of the following description, the same reference signs are used for identical elements or for elements performing the same function in the different embodiments of the method that are described.

The drawings are schematic representations, which, for the sake of readability, are not to scale. In particular, the thicknesses of the layers are not to scale with respect to the lateral dimensions of these layers.

The expression "thermal expansion coefficient" used in the remainder of this description in relation to a layer or substrate refers to the expansion coefficient in a direction defined in the main plane defining this layer or substrate. If the material is anisotropic, the retained value of the coefficient will be the value with the greatest amplitude. The value of the coefficient is that which is measured at room temperature.

FIG. 4 shows a surface acoustic device that can be produced using a method according to the present disclosure.

A thin ferroelectric layer 10 is placed in direct contact with a support 7, via a dielectric layer 7b. Metal electrodes 11a, 11b are arranged on the thin ferroelectric layer 10. As is well known per se, a high-frequency electrical signal applied to one of the electrodes propagates in the thin ferroelectric layer 10 in the form of a surface wave to be processed therein (for example, filtered) and recovered on the other electrode. The features of the thin ferroelectric layer 10 and, more generally, of all the layers forming the stack on which the thin ferroelectric layer 10 rests, are decisive for carrying out the desired processing of the electrical signal, in particular, the thickness and the monodomain crystal quality of the thin ferroelectric layer 10.

The features of the support 7 can affect, by acoustic coupling, the propagation of the wave in the thin layer 10. The nature and thickness of these layers can therefore also be decisive for carrying out the desired processing of the electrical signal, or at least influencing this processing. In the example shown in FIG. 4, the support 7 comprises a solid silicon part 7a, and a dielectric assembly layer 7b, preferably comprising an oxide, in direct contact with the thin ferroelectric layer 10. By way of example, the assembly layer 7b may be made of silicon oxide or silicon nitride, or be formed by a stack of layers composed of these materials. Preferably, the support 7 is electrically resistive, in order to avoid electrically coupling with the high-frequency signals applied to the electrodes 11a, 11b, which could affect their propagation. The solid part 7a can thus be formed by a high-resistivity silicon substrate, that is to say, having resistivity greater than 1000 ohm-centimeter, and more preferably still greater than 3000 ohm-centimeter.

To support the resistive nature of the support 7, in the example of FIG. 4, provision has been made for the insertion of a charge trapping layer 7c, for example, made up of polycrystalline silicon, between the solid part 7a and the assembly layer 7b. The formation of such a layer and its role contributing to the resistivity of the support substrate 7 are well known per se, and a detailed description thereof can be found in documents FR2860341, FR2933233, FR2953640, US2015115480. Of course, it is possible for this charge trapping layer 7c to be formed using a technique other than that providing a layer made up of polycrystalline silicon. This layer may also comprise carbon or be made up of or comprise silicon carbide or an alloy of silicon and carbon. Alternatively, it may be a matter of producing the electrical traps in the layer 7c by ion bombardment of relatively heavy species (for example, argon) in a surface part of the support in order to create crystal defects therein that are capable of trapping electric charges. It is also possible to provide a charge trapping layer 7c made up of a porous material, for example, by porosification of a surface part of the substrate 7 when the latter is made of silicon.

It has been noted that the device shown in FIG. 4 does not include electrodes under the thin ferroelectric layer 10. The presence of the dielectric assembly layer 7b does not allow contact with the rear face of the thin ferroelectric layer 10. Therefore, it is not possible to use the presence of such an electrode or the formation of an electrical contact to polarize the thin ferroelectric layer 10, as documented in the state of the art cited in the introduction to the application.

It is therefore important to have a method for preparing the thin ferroelectric layer 10 that can preserve or restore the monodomain nature of this layer 10, without requiring the application of a repolarization voltage.

With reference to FIGS. 1 and 2, and to allow the device shown in FIG. 4 to be produced, the present disclosure generally provides for transferring a first ferroelectric layer 3 onto a support substrate 7, the first layer 3 being taken from a monodomain ferroelectric donor substrate 1 by a transfer technique based on the implantation of light species such as hydrogen species.

According to this technique, hydrogen is implanted in a first face 4 of the donor substrate 1 in order to form a buried embrittlement plane 2 therein. A first layer 3 is defined in this way between the embrittlement plane 2 and the first face 4 of the donor substrate 1. Then the first face 4 of the donor substrate 1 is assembled with a support 7, in this case by means of a dielectric assembly layer 7b. The donor substrate 1 is then fractured at the embrittlement plane 2, for example, using moderate heat treatment and/or the application of a mechanical force. The first layer 3 is then freed from the donor substrate 1 to expose a free face 8 of the first layer, the other face 4 of the thin layer being in direct contact with the assembly layer 7b of the support substrate 7.

It is generally necessary to provide steps for preparing the first transferred layer 3 thus transferred onto the support 7, to form a "useful" thin layer 10. These steps generally aim to improve the crystal quality of the thin layer 10 and its surface condition (for example, its roughness). These preparation steps may comprise a step of thinning the first layer 3 (for example, by chemical-mechanical polishing, denoted "CMP" in the table below) and/or a step of heat treatment (in the case of a ferroelectric material, it can be heat treatment on the order of 500° C. in a neutral atmosphere or comprising oxygen, denoted "TTH" in the table below). It will be noted that this step of heat treating the free face 8 of the layer 3 is separate from that which caused the donor substrate to fracture. Indeed, with the layer 3 not yet having been fully released during the fracture annealing, this heat treatment cannot treat a free face thereof.

It has been, however, observed that a method for preparing a first layer 3 transferred onto the support substrate 7 aiming at forming a thin layer 10 could lead to the creation of a plurality of ferroelectric domains within the thin layer 10, giving it a multidomain nature. As already stated, such a feature makes the layer unsuitable for its use, since it affects the performance of the devices that are to be formed on/in the transferred thin layer, for example, surface acoustic devices similar to that shown in FIG. 4.

It has been observed that the nature and the sequence of the steps of preparing the first layer 3 could significantly affect the ferroelectric properties of the thin layer 10. From these first observations, an analysis of the various sequences of preparation steps has been carried out using a piezoelectric force microscopy (PFM) technique to characterize the monodomain or multidomain nature of the surface of the thin layer 10. These experiments are summarized in the table below.

TABLE 1

| Step 1 | Step 2 | Comment |
|---|---|---|
| No thin layer preparation step | | Monodomain, surface and/or crystal properties unfit for use |
| CMP | | Monodomain, surface and/or crystal properties unfit for use |
| TTH | | Multidomain |
| CMP | TTH | Multidomain (usual preparation method) |
| TTH | CMP | Monodomain |

It can be seen (1st row of the table) that the first layer 3 obtained at the end of the detachment step, and before any preparation, exhibits compliant ferroelectric qualities, that is to say, monodomain. However, the surface condition and the crystal quality of this layer require the application of preparation steps.

Row 4 of the table corresponds to the application of the method linking thinning and heat treatment (CMP+TTH), and it can be seen that at the end of this treatment the thin layer has a multidomain ferroelectric nature.

Rows 2 and 3 respectively represent the application of a single step of thinning CMP or heat treatment TTH. Both of these steps lead to non-compliant properties of the thin layer 3.

It has been realized, by successively applying a heat treatment step TTH followed by a thinning step CMP, that the obtained thin layer 10 had a monodomain distribution, as observed on the surface of this layer by PFM, of its ferroelectric polarization and an acceptable crystal and surface quality.

Additional analyses have made it possible to identify that the formation of multiple ferroelectric domains in the thin layer 10 could be linked to the presence of a strong hydrogen concentration gradient in the first layer 3 before its preparation. Indeed, it has been observed that the application of heat treatment on a layer having such a gradient leads to the formation of a plurality of ferroelectric domains. The hydrogen implanted in the donor substrate 1 during the step of defining the first layer 3 is distributed in this substrate according to a profile having a concentration peak at the embrittlement plane 2. After fracturing, the first ferroelectric layer 3 transferred onto the support substrate 7 thus has a significant concentration of hydrogen, on the order of $10^{21}$ at/cm$^3$, at its free face 8. This concentration decreases in the thickness of the thin layer in the direction of the support 7, to reach a level on the order of $10^{19}$ at/cm$^3$.

When the preparation steps are composed of a first step of thinning the first layer 3 to bring its thickness to the target thickness of the thin layer 10, followed by heat treatment, the latter is applied while the thinned layer still has a strong hydrogen gradient, especially in a surface portion of the thinned layer. This results in the transformation of a thickness or surface portion of the thin layer 10, in which the hydrogen gradient is substantial, into a plurality of ferroelectric domains.

When these two steps are reversed, the surface portion of the first layer 3 having a strong hydrogen concentration gradient is transformed to have a plurality of ferroelectric domains. However, this multidomain surface portion of the first layer 3 is eliminated by the following thinning step. This makes it possible to provide a thin layer 10 having the required monodomain quality.

It is to be noted that the heat treatment, whether carried out before or after the thinning step, results in diffusing the hydrogen, the layer of which is saturated, and reducing the gradient in the thickness of this layer. The heat treatments that could be subsequently applied to the preparation of the thin layer 10 are therefore less likely to affect the monodomain nature of this layer.

Very detailed analyses using observation by piezoelectric force microscopy of the thin layer 10, after the latter has been thinned, have also revealed that this thin layer 10 could have a buried multidomain portion, in contact with the assembly layer. This buried multidomain portion is not easily visible using a simple PFM surface observation, the measurement of which is limited to a depth of approximately 50 nm.

From PFM observations of the thinned layer for multiple samples, it has been determined that the nature of the dielectric assembly layer 7b plays an important role with respect to the redistribution of hydrogen in the ferroelectric layer during the heat treatment of the method for preparing the thin layer 10.

When the assembly layer 7b is hydrogen rich, as may be the case with certain deposited oxides or dielectrics, it forms a source of hydrogen that the heat treatment can cause to migrate into the ferroelectric layer with which it is in contact. This hydrogen particularly can accumulate in the ferroelectric layer at the interface of this layer with the assembly layer 7b. This migration and this accumulation can constitute a hydrogen concentration gradient enabling the multidomain transformation of a portion of the ferroelectric layer in contact with the assembly layer during the heat treatment.

When, on the contrary, the assembly layer 7b is relatively hydrogen depleted, that is to say that it has a lower hydrogen concentration than that present in the transferred ferroelectric layer, the excess hydrogen in the ferroelectric layer can be absorbed in the assembly layer 7b during the diffusion caused by the heat treatment. This thus prevents the accumulation of hydrogen at the assembly interface and avoids multidomain transformation in the portion of the ferroelectric layer near this interface.

The present disclosure takes advantage of these results and observations to propose a method for preparing the thin layer 10. More particularly, the present disclosure relates to a method for preparing a thin layer 10 of a ferroelectric material transferred from a donor substrate 1 onto a support substrate 7 by a transfer technique including an implantation of light species such as hydrogen species, as previously described very generally. Several embodiments exist for carrying out this transfer.

According to a first embodiment, shown in FIGS. 1A to D, the donor substrate 1 is composed of a solid, monodomain block of ferroelectric material, for example, of LiTaO$_3$, LiNbO$_3$, LiAlO$_3$, BaTiO$_3$, PbZrTiO$_3$, KNbO$_3$, BaZrO$_3$, CaTiO$_3$, PbTiO$_3$ or KTaO$_3$. The donor substrate 1 can assume the form of a circular wafer of standardized size, for example, 150 mm or 200 mm in diameter. However, the present disclosure is by no means limited to these dimensions or to this shape. The donor substrate 1 may have been removed from an ingot of ferroelectric materials, with this removal having been carried out so that the donor substrate 1 has a predetermined crystal orientation. The orientation is chosen according to the intended application. Thus, it is common practice to choose an orientation between 30° and 60° RY, or between 40° and 50° RY, in the case where the intention is to exploit the properties of the thin layer to form a SAW filter. However, the present disclosure is by no means limited to a particular crystal orientation.

Irrespective of the crystal orientation of the donor substrate 1, the method comprises the introduction of hydrogen into this donor substrate 1. This introduction can correspond to an implantation of hydrogen, that is to say, an ion bombardment of hydrogen of the planar face 4 of the donor substrate 1. It can naturally be expected that this introduction of hydrogen, for example, by implantation, is supplemented by the introduction of other light species, such as helium.

In a manner known per se, and as shown in FIG. 1B, the purpose of the implanted ions is to form an embrittlement plane 2 delimiting a first layer 3 of ferroelectric material to be transferred that is located on the side of the face 4 and another part 5 forming the rest of the substrate.

The nature, the dose of the implanted species and the implantation energy are chosen as a function of the thickness of the layer that is intended to be transferred and of the physico-chemical properties of the donor substrate 1. In the case of a donor substrate 1 made from LiTaO$_3$, it will thus be possible to choose to implant a hydrogen dose of between 1E16 and 5E17 at/cm$^2$ with energy that is between 30 and 300 keV to delimit a first layer 3 on the order of 200 to 2000 nm.

In a following step, shown in FIG. 1C, the flat face 4 of the donor substrate 1 is assembled with a face 6 of a support substrate 7. The support substrate 7 can be the same size and the same shape as those of the donor substrate 1. For availability and cost reasons, the support substrate 7 is a silicon, monocrystalline or polycrystalline wafer. More generally, however, the support substrate 7 can be formed by any material, for example, silicon, even an electrically insulating material such as sapphire or glass, and be any shape. To form the device shown in FIG. 4, a support substrate will be chosen that is formed by a solid part 7a made of highly resistive silicon provided with a charge trapping layer 7c, for example, made of polycrystalline silicon.

Prior to the assembly step, it is possible to contemplate preparing the faces of the substrates to be assembled using a cleaning, brushing, drying, polishing step or using plasma activation, for example, based on oxygen or nitrogen.

The assembly step may correspond to the close contact of the donor substrate 1 with the support substrate 7 by molecular adhesion and/or electrostatic bonding. To facilitate the assembly of the two substrates 1, 7, provision is made to form at least one dielectric assembly layer 7b on the face 6 of the support substrate 7 to be assembled. It is also or alternatively possible to provide for also forming an assembly layer on the face 4 of the donor substrate 1 to be assembled, preferably before the formation of the embrittlement plane 2. In other words, the dielectric assembly layer 7b can be formed, at least in part, on one and/or the other of the two substrates 1, 7.

The dielectric assembly layer 7b is, for example, formed by silicon oxide, or more generally by an oxide such as $Ta_2O_5$, $ZrO_2$ or HfO (these oxides being able, like $SiO_2$, to be formed by deposits), or silicon nitride, and is between a few nanometers and a few microns thick. The assembly layer 7b can be composed of a stack of different types of dielectric layers. The dielectric assembly layer 7b can be produced according to the various techniques that are known in the state of the art, such as thermal oxidation or nitriding treatments, chemical deposits (PECVD, LPCVD, etc.), etc.

In general, techniques for depositing or forming the assembly layer will be favored, leading to the incorporation of a small amount of hydrogen therein. It is to be noted that the choice of the material forming this assembly layer, its thickness and its formation technique is not entirely free. This choice may, in particular, be dictated by the properties of electrical insulation, propagation of acoustic waves and/or adhesion of this layer in the final structure and according to the intended application. Finally, it should be noted that it is generally easier and more universal to form the assembly layer by deposition, in particular, an oxide deposition, since this formation method can be carried out independently of the nature of the support and at relatively moderate temperatures, lower than 1000° C. or 950° C. or even lower than 900° C., which may sometimes be imposed by the nature of the solid part of the support 7a or by the existence of a trapping layer 7c.

According to an important feature of one embodiment, care will be taken to ensure that the dielectric assembly layer 7b has a hydrogen concentration lower than the average hydrogen concentration in the first layer 3. By estimating that a large majority of the hydrogen of the first layer 3 comes from the hydrogen implanted to form the embrittlement plane 2, the average concentration of hydrogen can be determined by dividing the implanted dose (in $at/cm^2$) by the thickness of the first layer (in cm). It is typically between $10^{20}$ $at/cm^3$ and $10^{22}$ $at/cm^3$. By way of example, in the case where the assembly layer 7b is formed by a silicon oxide deposited onto the support substrate, this oxide will be annealed, before the assembly step, so as to make a large part of the hydrogen it contains exodiffuse.

In general, a step of annealing the assembly layer 7b may be provided that aims to bring this dielectric layer to a temperature higher than the heat treatment for preparing the first transferred layer, which will be described later in this description. This layer can thus be brought to a temperature of 600° C., 700° C., or even 800° C. or more. The average hydrogen concentration in the assembly layer 7b, after this exodiffusion step, can thus be less than $5.10^{20}$ $at/cm^3$, or advantageously less than $10^{18}$ $at/cm^3$, or more advantageously less than $10^{18}$ $at/cm^3$. It will be noted that the annealing can modify features of the assembly layer other than its hydrogen concentration. It can, in particular, reduce the diffusivity of the hydrogen, that is to say, the capacity of this species to diffuse in the material forming the assembly layer, so that the hydrogen, even at a relatively high concentration (on the order of $10^{20}$ $at/cm^3$), is less likely to diffuse toward the first layer 3.

Alternatively or in addition to this embodiment, provision may be made to provide the dielectric assembly layer 7b with a barrier layer preventing the diffusion of hydrogen toward the first layer 3. By way of example, the assembly layer 7b can be formed by a stack formed by a first layer of oxide, for example, of silicon oxide, placed on the side of the support substrate 7a (or of the trapping layer 7c, when the latter is present) and a layer of silicon nitride placed on the side of the first ferroelectric layer 3. This nitride layer prevents the diffusion of any hydrogen that may be present in the silicon oxide layer toward the first ferroelectric layer 3.

According to yet another approach, provision can be made for the dielectric assembly layer to have any concentration of hydrogen, but for this layer to have very low diffusivity of this hydrogen, which therefore remains sufficiently trapped therein so as not to significantly diffuse toward the thin layer 3.

Such a layer can be formed by an oxide, for example, a silicon oxide SiON, having nitrogen in a nitrogen/oxygen ratio greater than or equal to 0.01, 0.05 or 0.1. When the assembly dielectric layer 7b is based on silicon oxide SiON, which is very common since this material has well-known features of formation, adhesion, electrical insulation and propagation of acoustic waves, a decision may be made not to exceed a nitrogen/oxygen ratio of any more than 0.1 or 0.25 so as not to modify these features excessively and to maintain behavior that is equivalent or close to that of a simple silicon oxide $SiO_2$. It is to be noted that such a nitrogen-rich oxide layer can easily be formed by a deposition technique, for example, PECVD, at least one of the carrier gases of which can be chosen to be nitrogen, which can be incorporated in the oxide layer in a controlled manner. The nitrogen/oxide ratio can be measured by a technique called EDX (for "energy-dispersive X-ray spectroscopy") or established from nitrogen and oxygen measurements determined by SIMS (secondary ion mass spectrometry) measurements in the oxide layer 4.

The dielectric assembly layer 7b can be formed, over its entire thickness, by a material having low diffusivity, for example, an oxide comprising nitrogen as mentioned above.

Alternatively, provision can be made for only a barrier layer preventing the diffusion of hydrogen to the first layer 3 to be made of this material having low diffusivity, as was described in the previous alternative. For example, a layer of silicon oxide having a high concentration of hydrogen can be formed by deposition on the support substrate, with this layer being prepared using a nitrogen-based plasma to superficially incorporate this nitrogen. A barrier layer of nitrogen-rich SiO is thus formed on this surface thickness, which prevents the diffusion of the hydrogen contained in the rest of the oxide.

When the solid part of the support 7a is provided on the surface with a charge trapping layer 7c comprising silicon, it is possible to contemplate forming the dielectric assembly layer 7b by thermal oxidation of a surface part of this trapping layer by treating it in an oxidizing atmosphere at a moderate temperature below 950° C. and preferably between 800° C. and 900° C. This thus avoids damaging, for example, by recrystallization, the charge trapping layer 7c by subjecting it to a high temperature, above 950° C. or 900° C. Optionally, a step of polishing the surface of the trapping layer 7c thus oxidized may be introduced in order to make it compatible with the subsequent assembly step.

Irrespective of the nature of the dielectric assembly layer 7b and of the treatments that it has undergone, at the end of this assembly step, the assembly shown in FIG. 1C is provided that comprises the two associated substrates, the flat face 6 of the support substrate 7 adhering to the flat face 4 of the donor substrate 1, by means of a dielectric assembly layer 7b.

The assembly is then treated to detach the first layer 3 of ferroelectric material from the donor substrate 1, by cleavage at the embrittlement plane 2.

This detachment step can thus comprise applying heat treatment to the assembly within a temperature range on the order of 80° C. to 300° to allow the first layer 3 to be transferred onto the support substrate 7. In place of or in addition to the heat treatment, this step may comprise the application of a blade or a jet of gaseous or liquid fluid, or any other force of a mechanical nature at the embrittlement plane 2.

Following this detachment step, the structure 9 shown in FIG. 1D is obtained. This structure 9 comprises the first layer 3 of ferroelectric material comprising a first free face 8 and a second face 4 (corresponding to the first face of the donor substrate) placed on the support substrate 7, the dielectric assembly layer 7b being placed between the first layer 3 and the rest of the support 7.

FIGS. 2A to 2D show a second embodiment, particularly suitable for producing a heterogeneous structure 9, in which the first layer 3 has a thermal expansion coefficient that is very different from that of the support, for example, having a difference of more than 10%.

With reference to FIG. 2A, the donor substrate 1 in this case is composed of a thick layer of ferroelectric material 1a, having the same properties as those described for the solid block of ferroelectric materials in relation to the first embodiment, and of a manipulator substrate 1b.

The manipulator substrate 1b is advantageously formed by a material (or a plurality of materials) providing it with a thermal expansion coefficient close to that making up the support substrate 7. "Close" means that the difference in the thermal expansion coefficient of the manipulator substrate 1b and that of the support is less, as an absolute value, than the difference in the thermal expansion of the solid block of ferroelectric material and that of the support substrate 7.

Preferably, the manipulator substrate 1b and the support substrate 7 have an identical thermal expansion coefficient. During the assembly of the donor substrate 1 and the support 7, a structure is formed that is capable of withstanding heat treatment at a relatively high temperature. For the sake of simplicity of implementation, this can be obtained by choosing the manipulator substrate 1b so that it is formed by the same material as that of the support substrate 7.

To form the donor substrate 1 of this embodiment, a solid block of ferroelectric material is first assembled with the manipulator substrate 1b, for example, according to a bonding technique by molecular adhesion as described above. Then, the layer of ferroelectric material 1a is formed by thinning, for example, by grinding and/or chemical-mechanical polishing and/or etching. Before assembly, provision may be made for the formation of an adhesion layer (for example, by depositing silicon oxide and/or silicon nitride) on one and/or the other of the faces brought into contact. The assembly may comprise the application of low-temperature heat treatment (for example, between 50 and 300° C., typically 100° C.) allowing sufficient strengthening of the bonding energy to allow the next step of thinning.

The manipulator substrate 1b is chosen to have a thickness that is substantially equivalent to that of the support substrate 7. The thinning step is carried out so that the thickness of the thick layer of ferroelectric material 1a is low enough for the stresses generated during the heat treatments applied in the rest of the method to have a lower intensity. At the same time, this thickness is high enough to be able to remove the first layer 3, or a plurality of such layers. This thickness can, for example, be between 5 and 400 microns.

The following steps of the method of this second embodiment are equivalent to those of the steps described in the first embodiment. Hydrogen is implanted within the thick layer of ferroelectric material 1a to generate an embrittlement plane 2, which marks the separation of the first layer 3 from the rest 5 of the donor substrate 1, as shown in FIG. 2B. This step is followed by the step of assembling the donor substrate 1 on the support substrate 7, as shown in FIG. 2C. A dielectric assembly layer 7b will have been provided between the donor substrate 1 and the support substrate 7, with this assembly layer having the same properties as those provided within the context of the first embodiment. It is to be noted that if it is decided to form a layer of silicon oxide (or a dielectric of any other nature requiring exodiffusion annealing of the hydrogen) on the face of the donor substrate 1 of this embodiment that is to be assembled, its thickness will be limited to a few nanometers, for example, less than 10 nm or 50 nm, because it can be difficult to apply exodiffusion annealing to this layer without risking damaging the donor substrate 1 composed of an assembly of materials having very different thermal expansion coefficients.

The first layer 3 is then detached from the rest of the substrate 5 in order to obtain the structure 9 shown in FIG. 2D.

This embodiment is advantageous in that the assembly formed from the donor substrate 1 and the support 7 can be exposed to a temperature that is much higher than that applied in the first embodiment, without any risk of uncontrolled fracturing of one of the substrates or delamination of the donor substrate 1. The balanced structure, in terms of the thermal expansion coefficient of this assembly, thus makes it possible to facilitate the step of detaching the first layer 3 by exposing the assembly to a relatively high temperature, for example, between 100° C. and 600° C.

Irrespective of the chosen embodiment, and as has been specified above, steps of preparing the first layer 3 are then required to form a thin layer 10 having a satisfactory crystal and surface quality.

As shown in FIG. 3A, this method initially comprises heat treatment of the free face 8 of the first transferred layer 3. This heat treatment allows crystal defects present in the first layer 3 to be rectified. In addition, it helps to consolidate the bonding between this layer 3 and the support 7. The studies set out above have shown that this heat treatment also had the effect, if it had a sufficient temperature, of causing the diffusion of the hydrogen contained in the first layer 3, in particular, in its surface portion, and causing the multidomain transformation of this surface portion. The surface portion can be approximately 50 nm thick or less and can be established over the entire extent of the layer 3. At the end of the heat treatment, the ferroelectric layer 10 has a relatively constant concentration of hydrogen in its thickness, and between $10^{18}$ and $10^{19}$ at/cm$^3$. It is to be noted that owing to the properties of the assembly layer 7b described above, the hydrogen contained in this assembly layer is not likely to diffuse toward the thin layer 3 during annealing and/or to be trapped at the interface existing between the assembly layer 7b and this layer. This thus avoids the formation of a hydrogen concentration gradient in this buried zone near this interface, and in this way this zone is prevented from being converted so that it has a multidomain characteristic.

A heat treatment for preparing the compliant thin layer 10 brings the structure to a temperature between 300° C. and the Curie temperature of the ferroelectric material (and preferably greater than or equal to 450° C., 500° or 550° to promote diffusion of hydrogen) for a period of between 30 minutes and 10 hours. The heat treatment can provide a gentle ramp. This heat treatment is preferably carried out by exposing the free face 8 of the first layer 3 to an oxidizing or neutral gaseous atmosphere, that is to say, without covering this face of the thin layer with a protective layer that could prevent exodiffusion of the hydrogen.

With reference to FIG. 3B, the preparation method also comprises thinning of the thin layer 3 after the heat treatment. This thinning can correspond to polishing of the free face 8 of the thin layer 3, for example, by mechanical, chemical-mechanical thinning techniques and/or chemical etching. It enables the free face 8 to be prepared so that it exhibits low roughness, for example, less than 0.5 nm RMS 5×5 μm by atomic force measurement (AFM), and the multidomain surface portion of the thin layer 10 to be removed. The removal of 100 to 300 nm of thickness is generally provided, in order to reach the target thickness of the thin layer 10, and in all cases a thickness greater than that of the multidomain surface portion.

This thus constitutes a thin monodomain layer over its entire thickness having the qualities required for the surface condition qualities, for crystal quality. The dielectric assembly layer 7b having a hydrogen concentration lower than that of the first layer 3 or comprising a barrier to the diffusion of hydrogen toward the first layer 3, avoids accumulating excess hydrogen in a buried zone of the thin layer 10, located near the assembly interface. This prevents the multidomain transformation of this zone, which would be impossible to eliminate.

Of course, the invention is not limited to the embodiments described and it is possible to add variants without departing from the scope of the invention as defined by the claims.

The invention claimed is:

1. A method for preparing a thin monodomain layer of ferroelectric material, comprising:
    implanting light species in a first face of a ferroelectric donor substrate to form an embrittlement plane and define a first layer between the embrittlement plane and the first face of the ferroelectric donor substrate;
    assembling the first face of the ferroelectric donor substrate to a support substrate using a dielectric assembly layer;
    fracturing the ferroelectric donor substrate at the embrittlement plane to transfer the first layer onto the support substrate and expose a free face of the first layer; and
    finishing the first layer, the finishing comprising a heat treatment of the free face of the first layer, followed by thinning of the first layer to form the thin monodomain layer;
    wherein the dielectric assembly layer comprises an oxide preventing diffusion of hydrogen toward the first layer, or the dielectric assembly layer comprises a barrier preventing diffusion of hydrogen toward the first layer.

2. The method of claim 1, wherein the thinning of the first layer comprises a chemical-mechanical polishing applied to the free face of the first layer.

3. The method of claim 1, wherein the heat treatment is carried out at a temperature between 300° C. and the Curie temperature of the ferroelectric material making up the first layer, and for a period of between 30 minutes and 10 hours.

4. The method of claim 1, wherein the heat treatment is carried out under an oxidizing or neutral gaseous atmosphere.

5. The method of claim 1, wherein the donor substrate comprises a ferroelectric material chosen from $LiTaO_3$ or $LiNbO_3$.

6. The method of claim 1, wherein the ferroelectric material has a crystal direction of between 30° and 60° RY.

7. The method of claim 1, wherein the support substrate comprises silicon.

8. The method of claim 1, wherein the donor substrate is a block of solid material.

9. The method of claim 1, wherein the donor substrate comprises a thick layer of ferroelectric material positioned on a manipulator substrate.

10. The method of claim 9, wherein the manipulator substrate has a thermal expansion coefficient identical or close to a thermal expansion coefficient of the support substrate.

11. The method of claim 1, wherein a material of the first layer and a material of the support substrate have different thermal expansion coefficients.

12. The method of claim 1, wherein the dielectric assembly layer comprises an oxide having nitrogen in a nitrogen/oxygen ratio greater than or equal to 0.01 or 0.05.

13. The method of claim 1, wherein the dielectric assembly layer comprises a silicon oxide having nitrogen in a nitrogen/oxygen ratio of between 0.01 and 0.25.

14. The method of claim 1, wherein the dielectric assembly layer comprises a stack of layers including a first oxide layer disposed on a side of the stack of layers adjacent the support substrate and a layer of silicon nitride disposed on a side of the stack of layers adjacent the first layer.

15. A device, comprising:
    a thin fully monodomain layer of a ferroelectric material layer;
    a dielectric assembly layer in contact with the thin layer and comprising an oxide preventing the diffusion of hydrogen toward the thin layer, or comprising a barrier preventing the diffusion of hydrogen toward the thin layer; and
    a support substrate in contact with the dielectric layer.

16. The device of claim 15, wherein the support substrate includes a charge trapping layer between a solid part of the support substrate and the dielectric assembly layer.

17. The device of claim 15, wherein the dielectric assembly layer comprises an oxide having nitrogen in a nitrogen/oxygen ratio greater than or equal to 0.01 or 0.05.

18. The device of claim 15, wherein the dielectric assembly layer comprises a silicon oxide having nitrogen in a nitrogen/oxygen ratio of between 0.01 and 0.25.

19. The device of claim 15, wherein the dielectric assembly layer comprises a stack of layers including a first oxide layer on the side of the support substrate and a layer of silicon nitride on the side of the first layer.

* * * * *